(12) United States Patent
Cheng et al.

(10) Patent No.: US 9,837,277 B2
(45) Date of Patent: Dec. 5, 2017

(54) FORMING A CONTACT FOR A TALL FIN TRANSISTOR

(71) Applicants: International Business Machines Corporation, Armonk, NY (US); GlobalFoundries, Inc., Grand Cayman (KY)

(72) Inventors: Kangguo Cheng, Schenectady, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/824,360

(22) Filed: Aug. 12, 2015

(65) Prior Publication Data

US 2017/0047256 A1    Feb. 16, 2017

(51) Int. Cl.
| | |
|---|---|
| H01L 29/06 | (2006.01) |
| H01L 29/66 | (2006.01) |
| H01L 21/306 | (2006.01) |
| H01L 21/285 | (2006.01) |
| H01L 29/78 | (2006.01) |
| H01L 29/08 | (2006.01) |
| H01L 29/45 | (2006.01) |
| H01L 21/283 | (2006.01) |
| H01L 21/8234 | (2006.01) |
| H01L 27/088 | (2006.01) |
| H01L 29/417 | (2006.01) |

(52) U.S. Cl.
CPC ...... *H01L 21/28518* (2013.01); *H01L 21/283* (2013.01); *H01L 21/823418* (2013.01); *H01L 21/823431* (2013.01); *H01L 27/0886* (2013.01); *H01L 29/0847* (2013.01); *H01L 29/41791* (2013.01); *H01L 29/45* (2013.01); *H01L 29/456* (2013.01); *H01L 29/66795* (2013.01); *H01L 29/7851* (2013.01); *H01L 29/665* (2013.01); *H01L 2029/7858* (2013.01)

(58) Field of Classification Search
None
See application file for complete search history.

(56) References Cited

U.S. PATENT DOCUMENTS

| | | |
|---|---|---|
| 7,122,412 B2 | 10/2006 | Chen et al. |
| 7,332,774 B2 | 2/2008 | Cho et al. |
| 7,531,423 B2 | 5/2009 | Cheng et al. |

(Continued)

OTHER PUBLICATIONS

Cheng, Kangguo, et al.; "Forming a Contact for a Tall Fin Transistor"; U.S. Appl. No. 15/227,142, filed Aug. 3, 2016.

(Continued)

*Primary Examiner* — Alexander Ghyka
(74) *Attorney, Agent, or Firm* — Cantor Colburn LLP; Vazken Alexanian

(57) ABSTRACT

A method of making a semiconductor device includes forming a recessed fin in a substrate, the recessed fin being substantially flush with a surface of the substrate; performing an epitaxial growth process over the recessed fin to form a source/drain over the recessed fin; and disposing a conductive metal around the source/drain.

6 Claims, 21 Drawing Sheets

(56) References Cited

U.S. PATENT DOCUMENTS

| | | |
|---|---|---|
| 8,610,201 B1 | 12/2013 | Hokazono |
| 2007/0111439 A1* | 5/2007 | Jung ........................ H01L 21/84 |
| | | 438/254 |
| 2011/0147840 A1 | 6/2011 | Cea et al. |
| 2012/0083107 A1 | 4/2012 | Chang et al. |
| 2014/0117462 A1 | 5/2014 | Cheng et al. |
| 2014/0239395 A1 | 8/2014 | Basker et al. |
| 2014/0273369 A1 | 9/2014 | Wei et al. |
| 2014/0284723 A1* | 9/2014 | Lee ......................... H01L 21/76 |
| | | 257/369 |
| 2015/0041908 A1 | 2/2015 | Adam et al. |

OTHER PUBLICATIONS

List of IBM Patents or Patent Applications Treated as Related—Date Filed: Aug. 3, 2016, Year; 2 pages.

* cited by examiner

FORMING A CONTACT FOR A TALL FIN TRANSISTOR

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

According to an embodiment of the present invention, a method of making a semiconductor device includes forming a recessed fin in a substrate, the recessed fin being substantially flush with a surface of the substrate; performing an epitaxial growth process over the recessed fin to form a source/drain over the recessed fin; and disposing a conductive metal around the source/drain.

In another embodiment, a method of making a semiconductor device includes patterning an array of fins in a substrate; depositing a sacrificial material within gaps between fins in the array of fins; recessing the array of fins to form recessed fins that are substantially flush with a surface of the substrate; performing an epitaxial growth process over the recessed fins and between the sacrificial material to form source/drain regions over the recessed fins; and disposing a conductive metal around the source/drains to form source/drain contacts.

Yet, in another embodiment, a semiconductor device includes a recessed fin patterned in a substrate, the recessed fin being substantially flush with a surface of the substrate; an epitaxial growth over the recessed fin; and a conductive metal surrounding the epitaxial growth.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-11B illustrate an exemplary method of making a semiconductor device according to embodiments of the present invention, in which:

FIG. 1 is a cross-sectional side view of an array of fins patterned in a substrate;

FIG. 2 is a cross-sectional side view after depositing a conformal sacrificial layer over the fins;

FIG. 3 is a cross-sectional side view after etching back the conformal sacrificial layer;

FIG. 4 is a cross-sectional side view after depositing a conformal liner over the fins;

FIG. 5 is a cross-sectional side view after depositing a blanket oxide layer;

FIG. 8 is a cross-sectional side view after performing a confined epitaxial growth process over the original fins;

FIG. 9 is a cross-sectional side view after depositing an oxide layer over the epitaxial growth;

FIG. 11B is a cross-sectional side view after planarizing the conductive metal.

DETAILED DESCRIPTION

Figure 1:
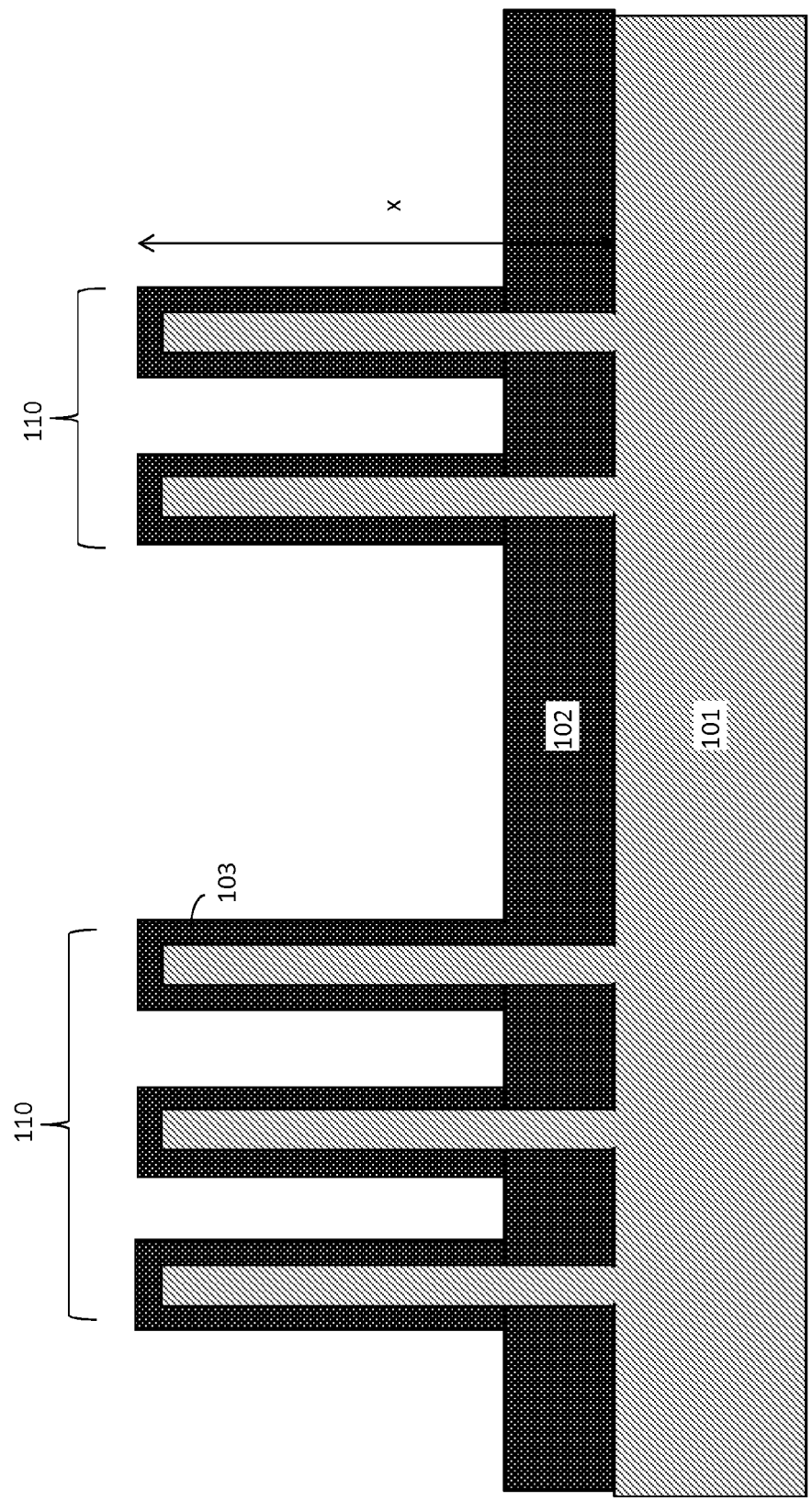

A FinFET with tall fin structures (e.g., at least 50 nanometers (nm)) provides several advantages compared to a device with shorter fin structures. A taller fin provides increased channel width, while maintaining comparable capacitance compared to a shorter fin. However, forming contacts for tall fins is challenging because current must travel a relatively long distance through the epitaxial material surrounding the tall fins before reaching the channel, which results in higher resistance.

Accordingly, embodiments of the present invention provide methods of making semiconductor devices with tall and discrete epitaxial source/drain regions over recessed fin structures. Conductive contact materials surround the discrete epitaxial source/drain regions to merge the epitaxial source/drain regions and form an all-around fin in the epitaxial source/drain regions. Embodiments of the inventive structures and methods provide reduced contact resistance. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIG. 1 is a cross-sectional side view of an array of fins 110 patterned in a substrate 101. The cross-section shown is in the source/drain region of a semiconductor device. Semiconductor devices may include one or more fins. To form the fins 110, lithography and etching are performed. Lithography can include forming a photoresist (not shown) on the substrate 101, exposing the photoresist to a desired pattern of radiation, and then developing the exposed photoresist with a resist developer to provide a patterned photoresist. At least one etch is employed to transfer the pattern from the patterned photoresist into the substrate 101 and form the fins 110. The etching process may be a dry etch (e.g., reactive ion etching, plasma etching, ion beam etching, or laser ablation). The etching process may be a wet chemical etch (e.g., potassium hydroxide (KOH)). Both dry etching and wet chemical etching processes may be used. After transferring the pattern, the patterned photoresist is removed utilizing resist stripping processes, for example, ashing.

The individual fins 110 have an initial height (x) of at least 50 nanometers (nm). In one aspect, the fins 110 have a height in a range from about 20 to about 120 nm. In another aspect, the fins 110 have a height in a range from about 40 to about 70 nm.

Non-limiting examples of suitable substrate 101 materials include silicon, silicon dioxide, aluminum oxide, sapphire, germanium, gallium arsenide (GaAs), an alloy of silicon and germanium, indium phosphide (InP), or any combination thereof. Other examples of suitable substrates include silicon-on-insulator (SOI) substrates with buried oxide (BOX) layers. The thickness of the substrate 101 is not intended to be limited. In one aspect, the thickness of the substrate 101 is in a range from about 30 nm to about 200 micrometers (µm).

The substrate 101 includes shallow trench isolation (STI) regions 102. The STI regions 102 are isolation regions formed by etching trenches in the substrate 101 and filling the trenches with, for example, silicon dioxide. Alternatively, the trenches may be lined with a silicon oxide liner formed by a thermal oxidation process and then filled with additional silicon oxide or another material.

The fins 110 are surrounded by an insulating oxide layer 103, which is deposited over the fins 110 by a suitable deposition process. The insulating oxide layer 103 surrounds the fin sidewalls and functions as a "dummy" sidewall material that will be removed after the fins are recessed (see FIG. 7D). The insulating oxide layer 103 may include, for example, silicon dioxide, or other dielectric material. The thickness of the oxide layer 103 around the fins 110 is not intended to be limited. In one aspect, the thickness of the oxide layer 103 is in a range from about 1 to about 10 nm. In another aspect, the thickness of the oxide layer 103 is in a range from about 3 to about 7 nm.

Figure 2:
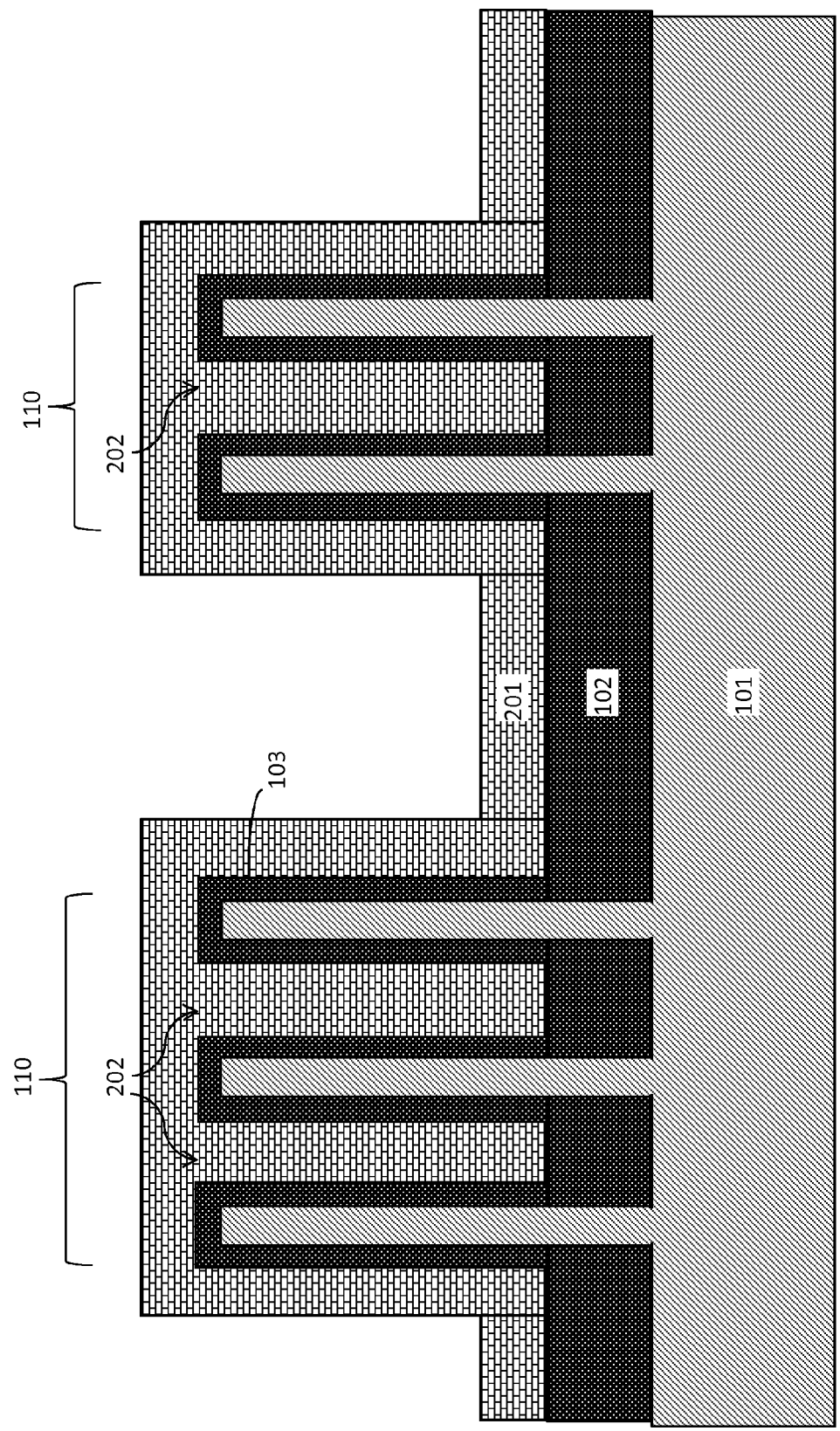

FIG. 2 is a cross-sectional side view after depositing a conformal sacrificial layer 201 over the fins 110. The conformal sacrificial layer 201 includes a sacrificial material and forms a pinch-off spacer between the fins 110. The pinch-off spacer fills the gaps 202 between the fins 110. Non-limiting examples of suitable materials for the sacrificial layer 201 include oxides (e.g., aluminum oxide). The thickness of the sacrificial layer 201 can generally vary and is not intended to be limited. In one aspect, the thickness of the sacrificial layer 201 is in a range from about 5 to about 30 nm. In another aspect, the thickness of the sacrificial layer 201 is in a range from about 8 to about 15 nm. The sacrificial layer 201 may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

Figure 3:
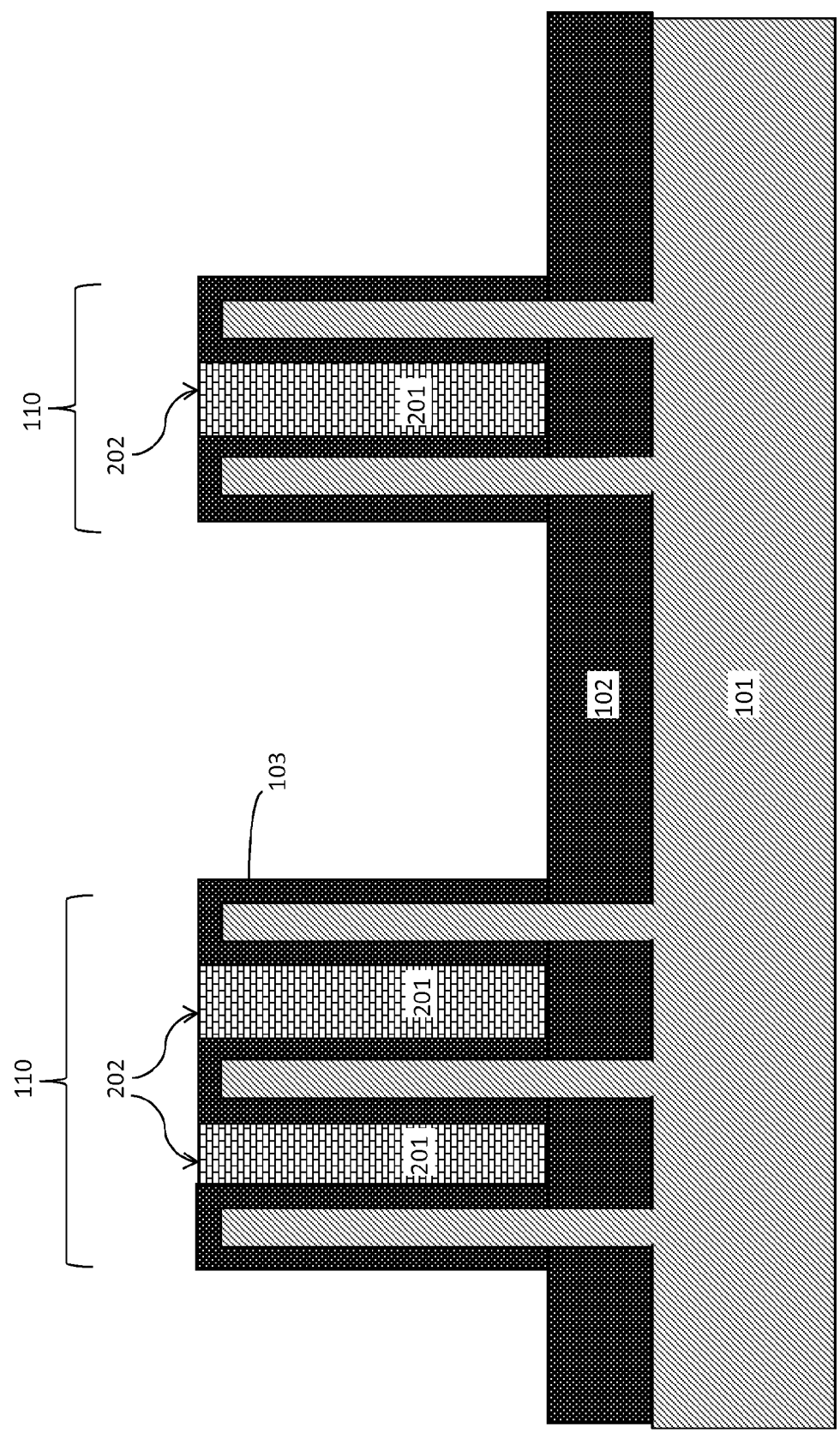

FIG. 3 is a cross-sectional side view after etching back the sacrificial layer 201. An isotropic etching process is employed to etch back the conformal sacrificial layer 201 from the end of the fin arrays, while leaving the sacrificial material in the gaps 202 between the fins 110. Isotropic etching is used to sacrificial layer 201 using an etchant substance. Non-limiting examples of isotropic etchants include hydrofluoric acid (HF), hydrofluoric nitric acid (HNA), and phosphoric acid.

Figure 4:
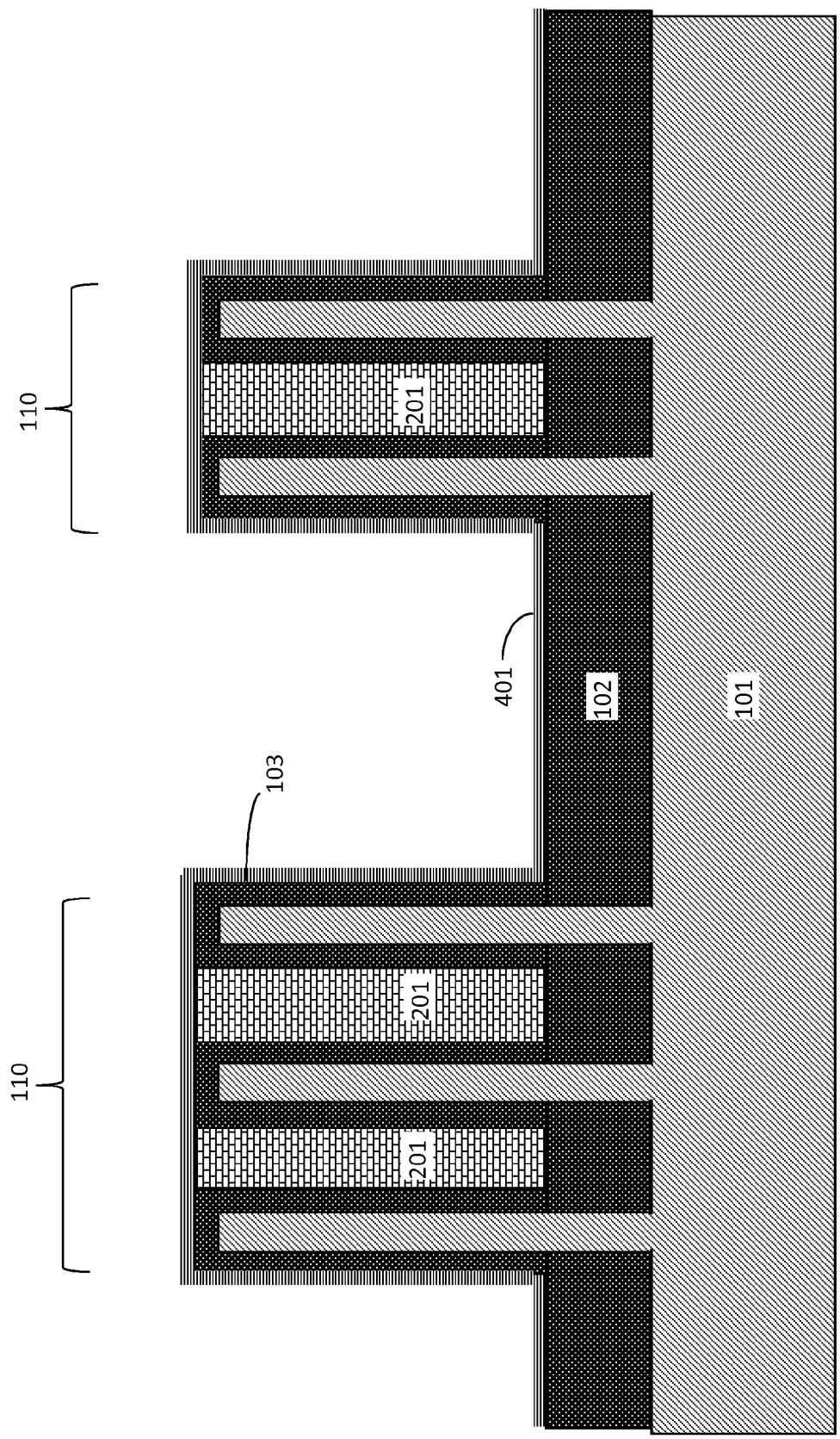

FIG. 4 is a cross-sectional side view after depositing a conformal liner 401 over the fins 110. The conformal liner 401 includes an insulating material. Non-limiting examples of suitable insulating materials include silicon nitride, silicon dioxide, aluminum oxide, or any combination thereof. The thickness of conformal liner 401 around the fins 110 is not intended to be limited. In one aspect, the thickness of the liner 401 is in a range from about 1 to about 6 nm. In another aspect, the thickness of the liner 401 is in a range from about 1 about 5 nm.

Figure 5:
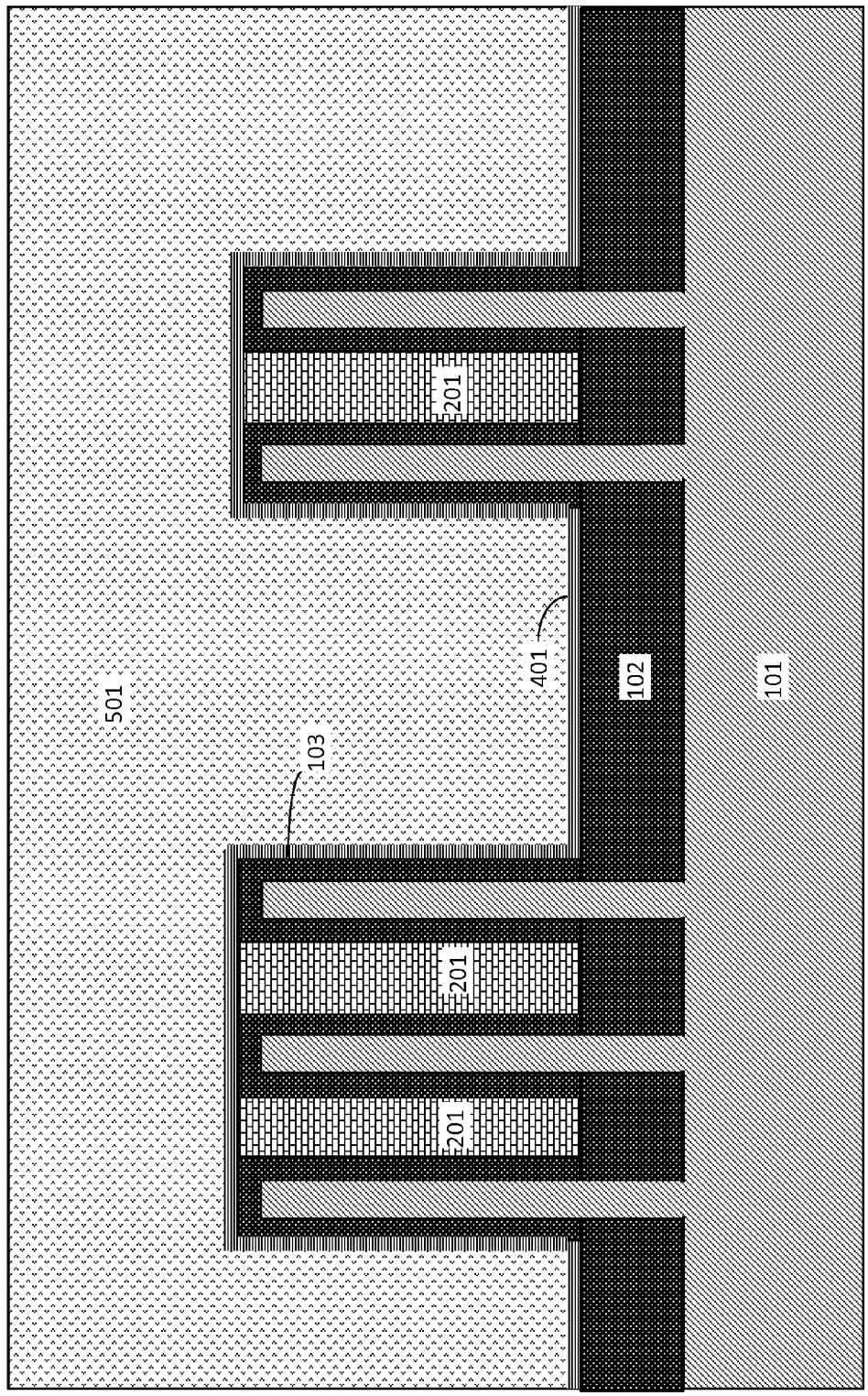

FIG. 5 is a cross-sectional side view after depositing a blanket oxide 501 over the fins 110. Non-limiting examples of oxides include silicon oxide, tetraethylorthosilicate (TEOS) oxide, high aspect ratio plasma (HARP) oxide, silicon oxide, high temperature oxide (HTO), high density plasma (HDP) oxide, oxides (e.g., silicon oxides) formed by an atomic layer deposition (ALD) process, or any combination thereof.

Figure 6A:
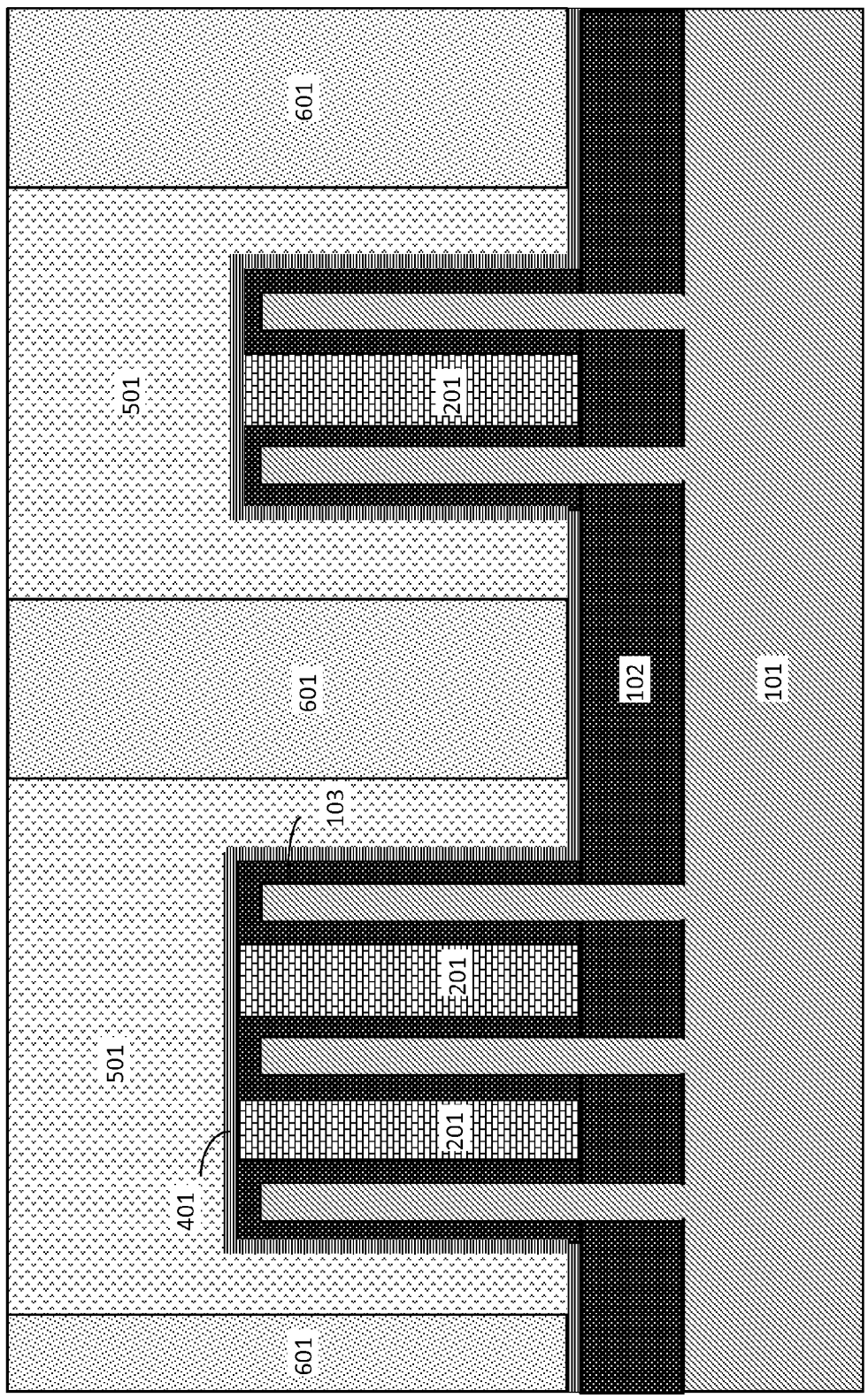
FIG. 6A is a cross-sectional side view after forming confinement trenches for epitaxial contact formation.

FIG. 6A is a cross-sectional side view after forming confinement trenches 601 for epitaxial contact formation. Lithography and etching processes are performed as described above. For example, a photoresist (not shown) may be disposed onto the blanket oxide 501 and patterned to provide a patterned photoresist. An etching process is performed to remove the blanket oxide 501 material from the confinement trench 601 regions. The confinement trenches 601 are filled with a suitable spacer material, for example, a material including Si, N, and at least one element selected from the group consisting of C and B. The spacer material may include Si, N, B, and C. For example, the spacer material may be SiBN, SiCN, SiBCN, or SiCBN.

Figure 6B:
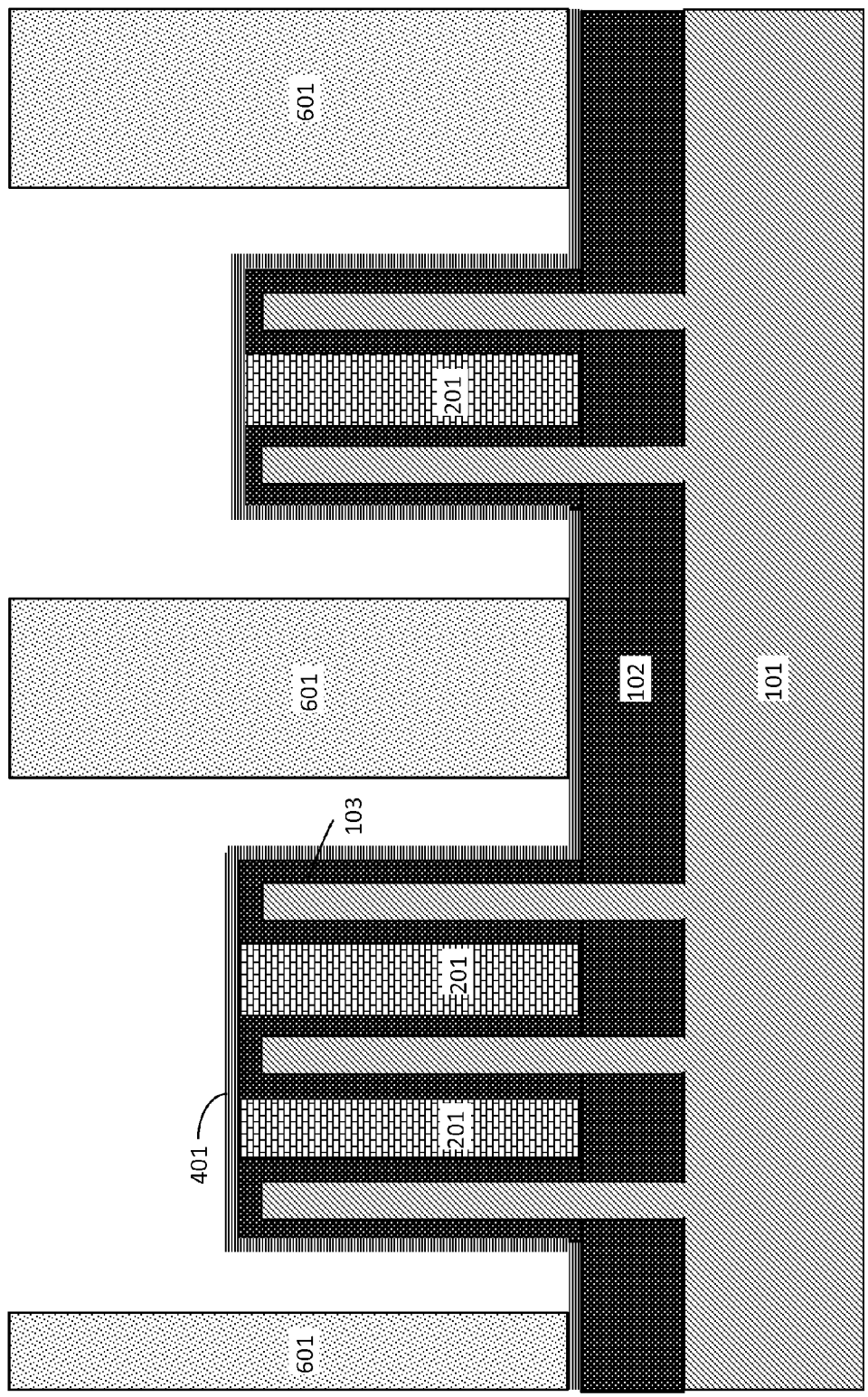
FIG. 6B is a cross-sectional side view after removing the blanket oxide layer.

FIG. 6B is a cross-sectional side view after removing the oxide 501 material to form recessed areas between the confinement trenches 601. The liner 401 surrounding the fins 110 is exposed. An etching process that is selective to (will not remove) the material forming the liner 401 surrounding the fins 110 is employed. When the liner 401 includes, for example, silicon nitride, a wet etching process, such as a buffered HF process may be used.

Figure 6C:
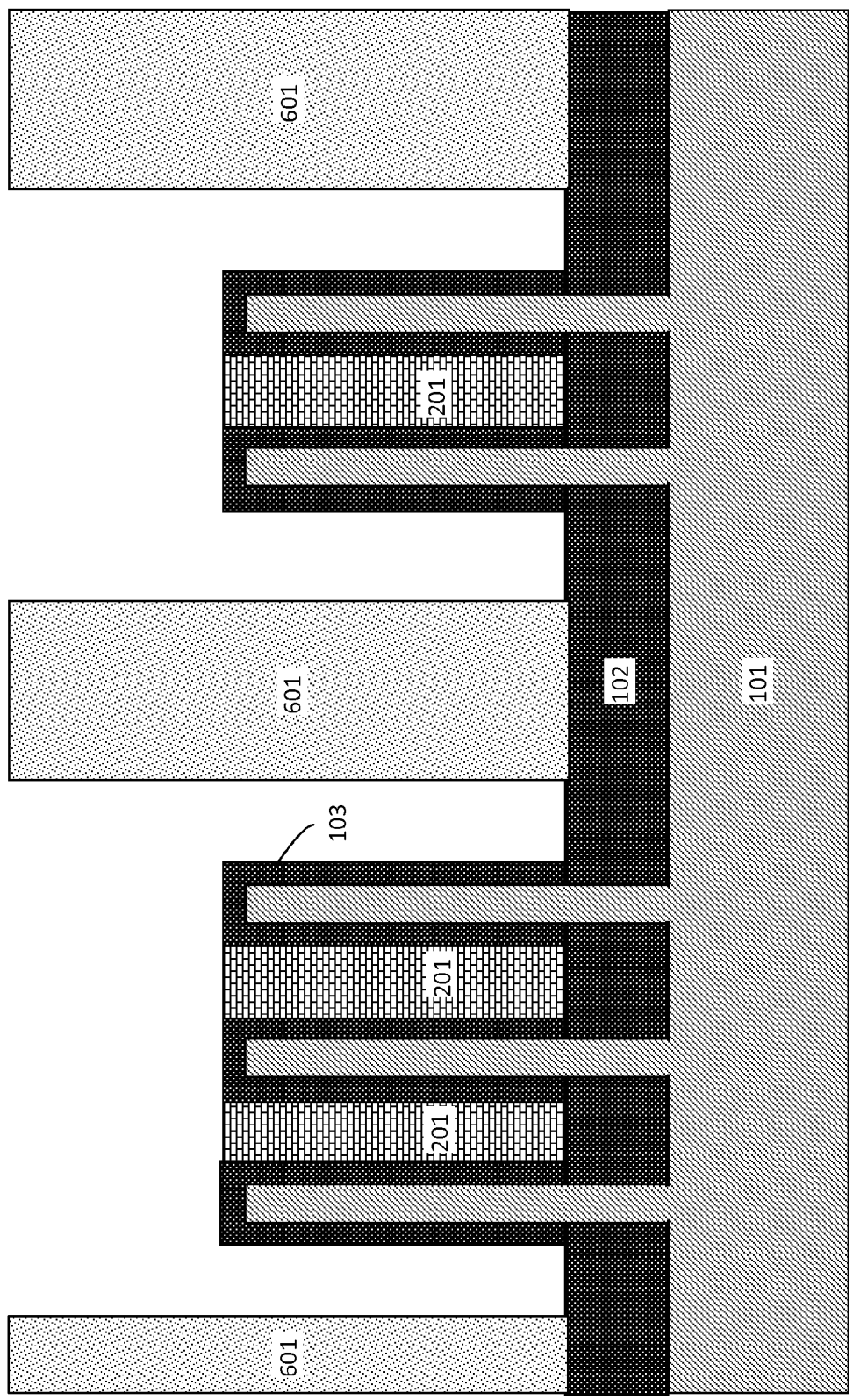
FIG. 6C is a cross-sectional side view after removing the conformal liner.

FIG. 6C is a cross-sectional side view after selectively removing the liner 401. Another etching process that is selective to (will not remove) the confinement trench 601 material is employed to remove the liner 401. In an exemplary embodiment, the liner 401 includes silicon nitride, and a HF solution diluted by ethylene glycol is used to selectively etch the liner 401.

Figure 7A:
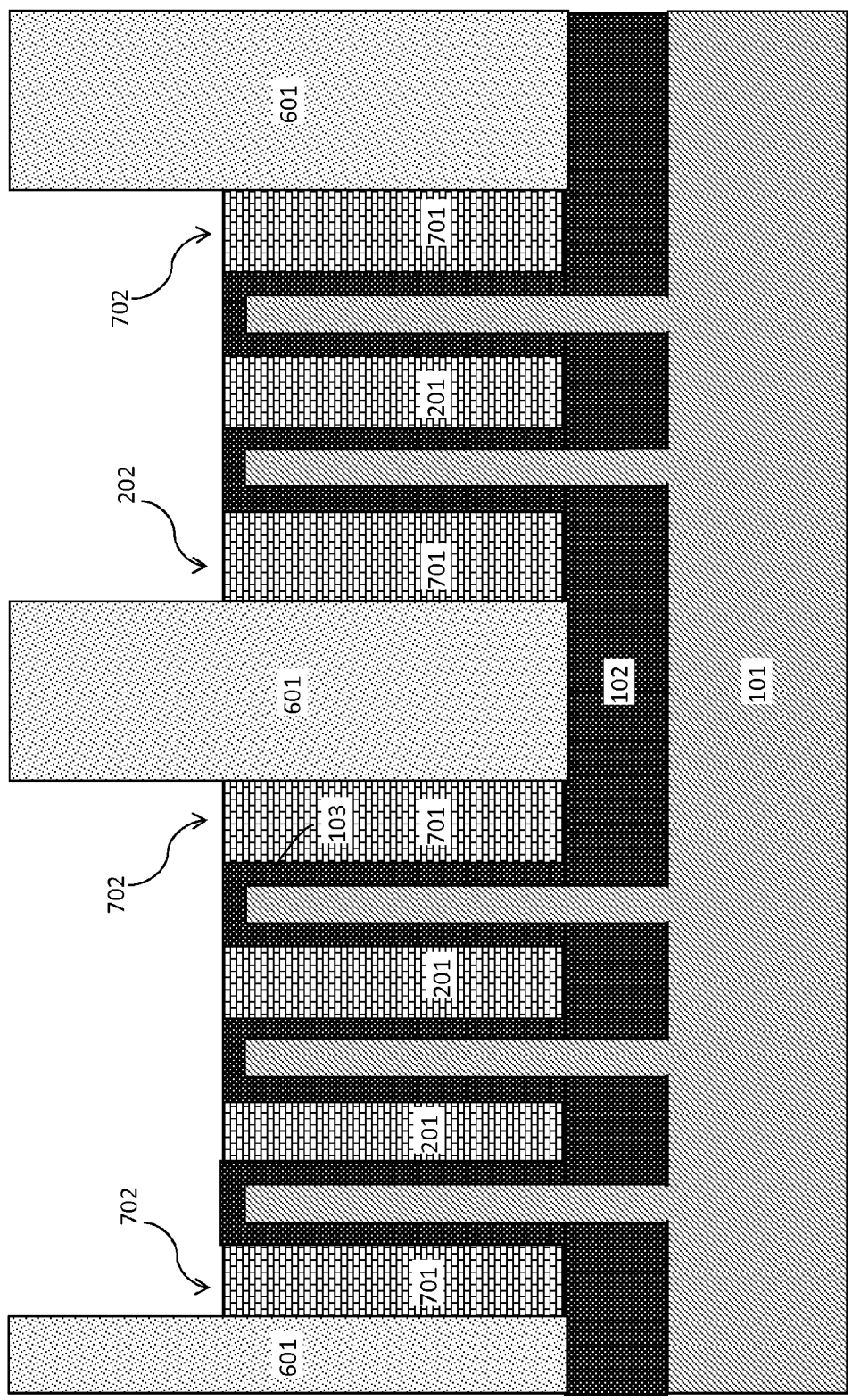
FIG. 7A is a cross-sectional side view after depositing another sacrificial material around the fins.

FIG. 7A is a cross-sectional side view after depositing another sacrificial material layer 701 around the fins 110. The sacrificial material layer 701 is initially deposited as a conformal layer (not shown) as shown in for sacrificial layer 201 in FIG. 2A. The sacrificial material fills the gaps 702 between the confinement trench 601 and the sidewall of the outermost fin in the fin arrays. The sacrificial material layer 701 may be the same or different than the sacrificial layer 201. An etching process is performed to etch back the material covering the fins 110 and to provide a planarized surface.

Figure 7B:
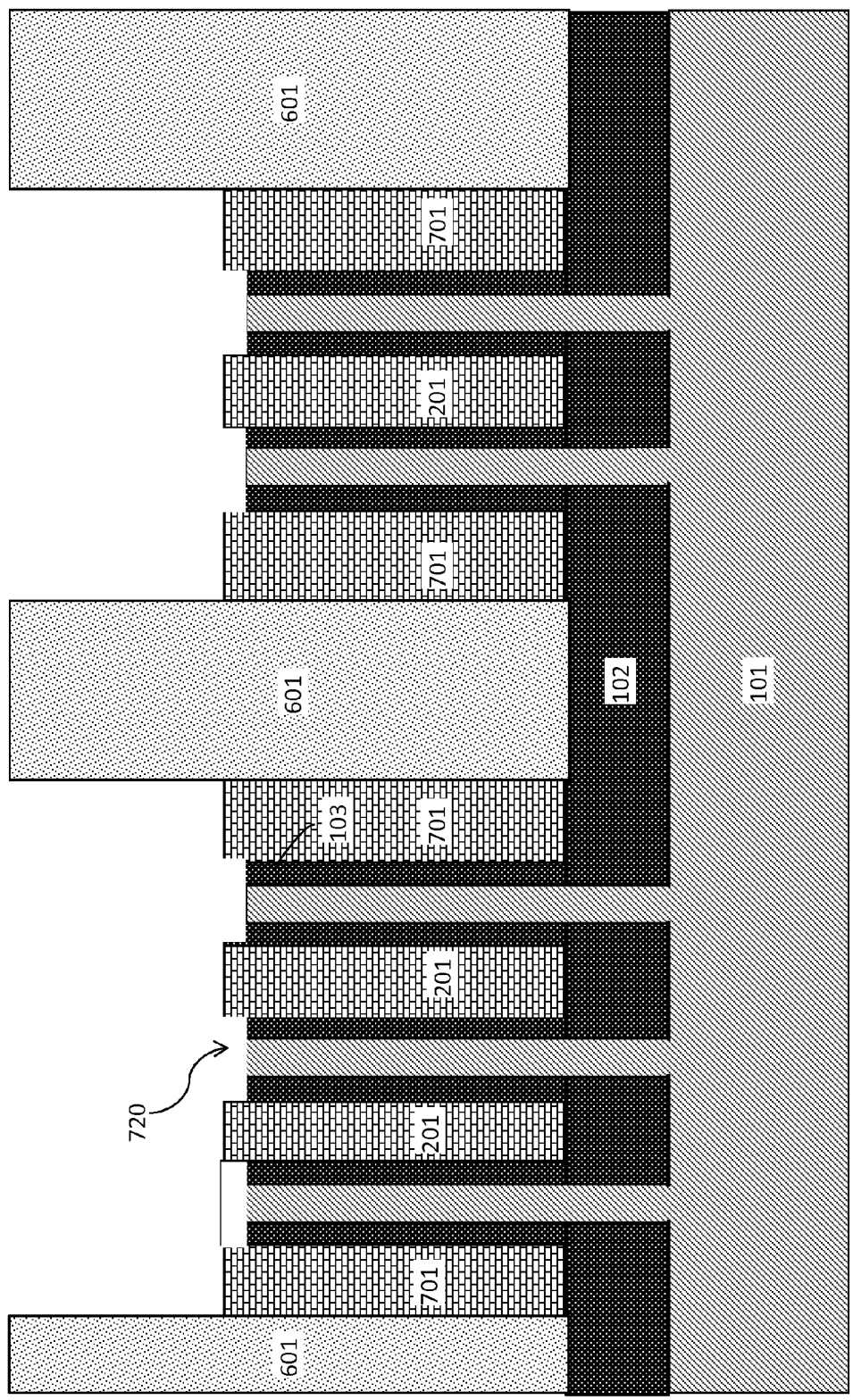
FIG. 7B is a cross-sectional side view after etching back the fins between the sacrificial material.

FIG. 7B is a cross-sectional side view after etching back the fins 110 and surrounding insulating oxide layer 103 between the sacrificial material in layers 201 and 701. An etching process, for example, reactive ion etching (RIE), that is selective to (will not remove) the sacrificial material is performed. Etching back the fins 110 forms fin recesses 720. The fins 110 are etched back to open the oxide layer 103 on top of the fins 110 to enable further etching of the fins 110.

Figure 7C:
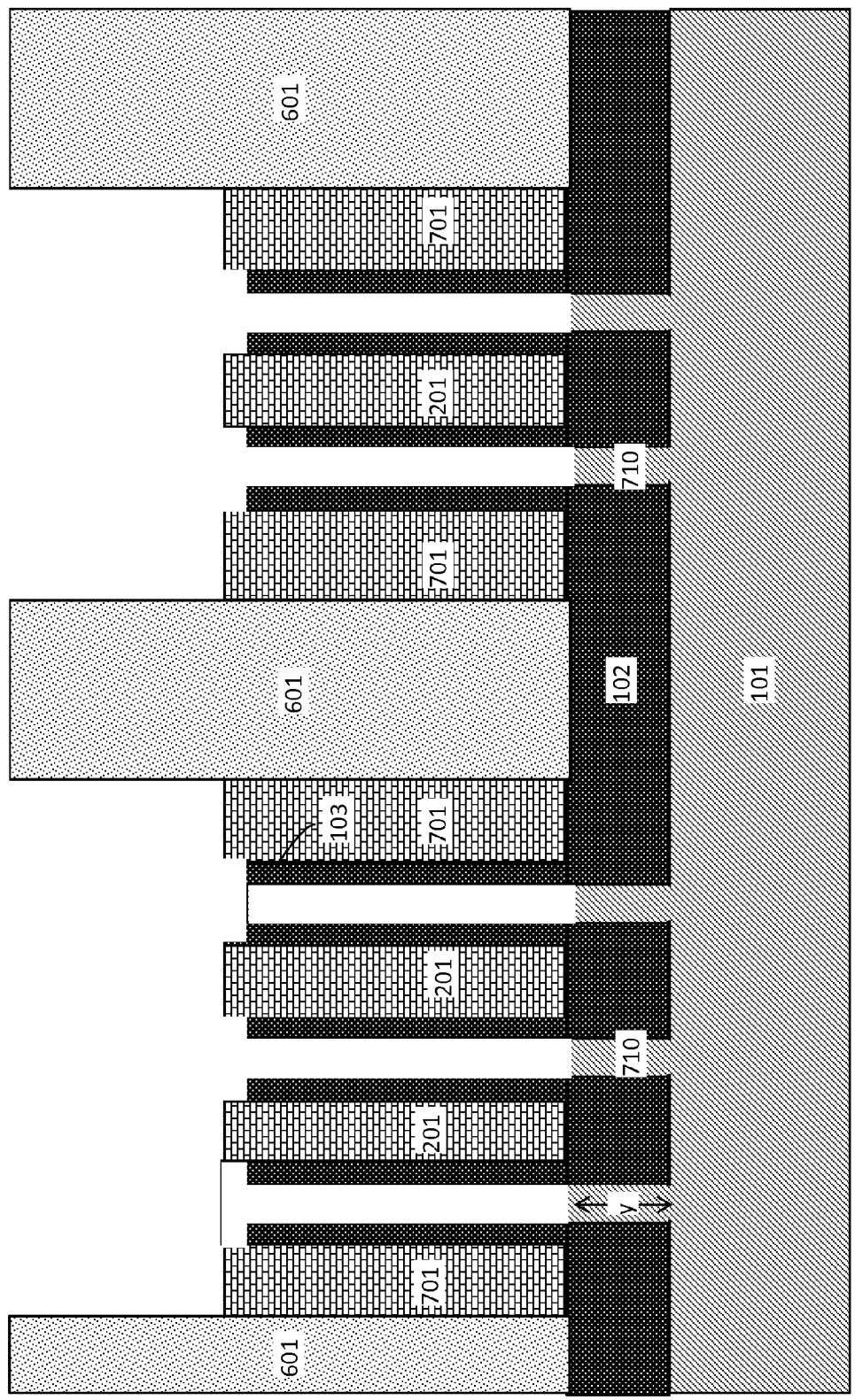
FIG. 7C is a cross-sectional side view after removing the original fin material down to the level of the substrate.

FIG. 7C is a cross-sectional side view after removing the original fin material down to the level of the STI region 102 in the substrate 101. The original fins were formed from the substrate 101 material, as shown in FIG. 1. An etching process is performed to remove the fin material from within the insulating oxide layer 103 surrounding the fins 110 to form recessed fins 710. The recessed fins 710 are substantially flush with the substrate 101 surface. The recessed fins 710 have a height (y) in a range from about 20 to about 120 nm. In one aspect, the recessed fins 710 have a height in a range from about 40 to about 70 nm.

Figure 7D:
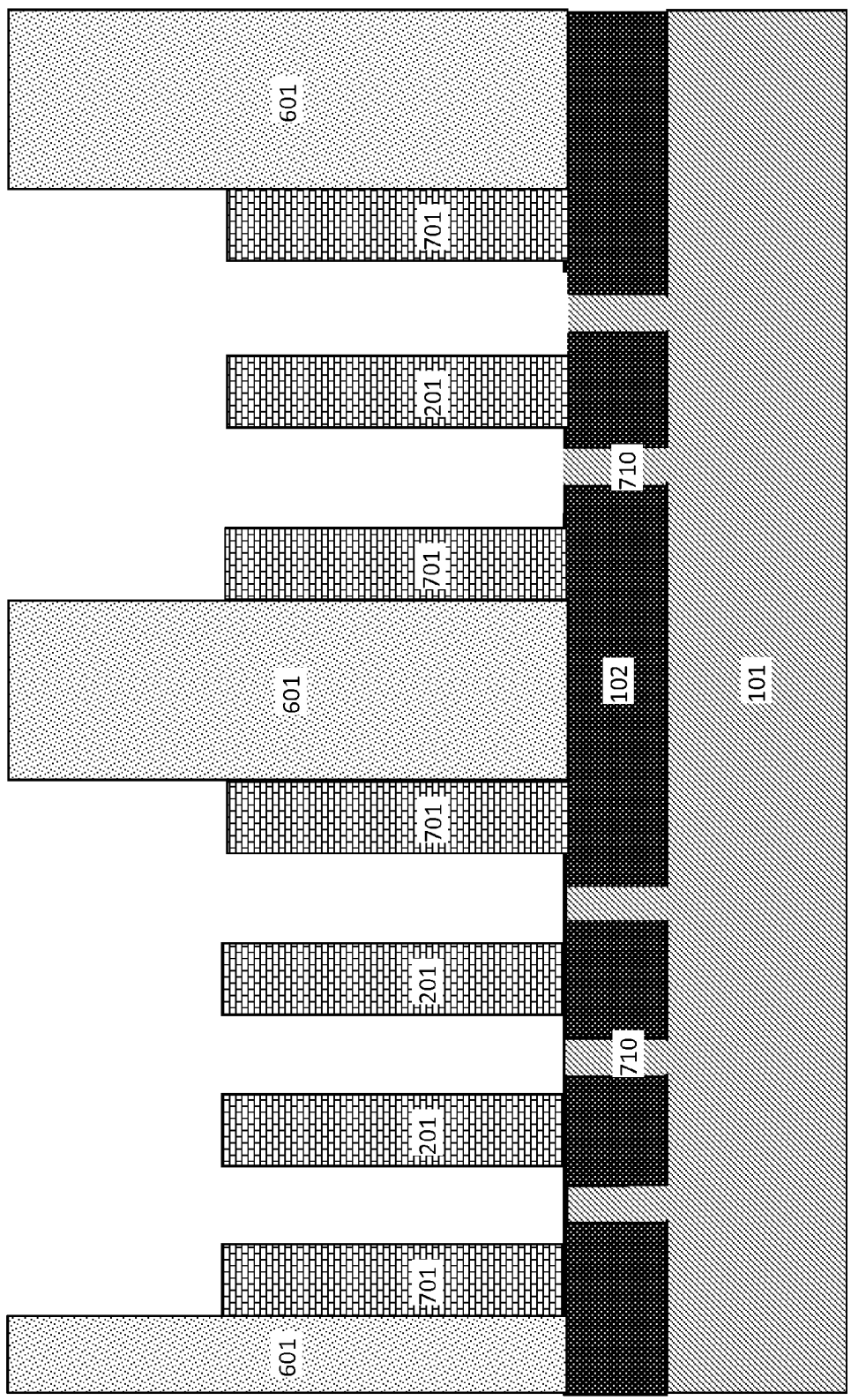
FIG. 7D is a cross-sectional side view after removing the oxide surrounding the fins.

FIG. 7D is a cross-sectional side view after removing the oxide layer 103 surrounding the fins 110. The oxide layer 103 may be removed by a cleaning process, e.g., by in-situ dry chemical cleaning technology (SiConi), chemical oxide removal (COR) dry etching, or dilute hydrofluoric acid (dHF) wet etching. The sacrificial material in layers 201 and 701 remain between the confinement trenches 601. Open areas over the recessed fins 710 are between the sacrificial material in layers 201 and 701.

Figure 8:
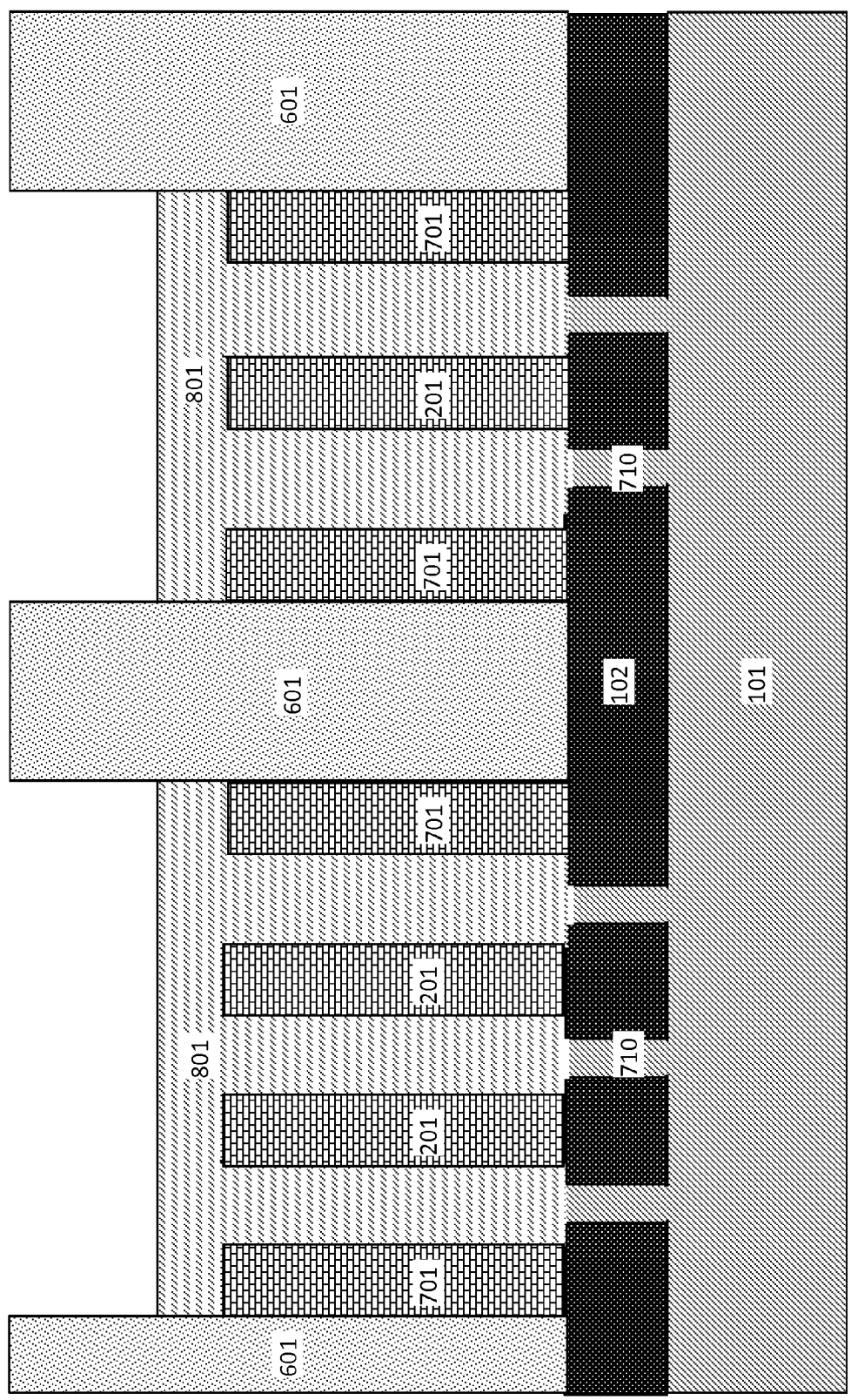

FIG. 8 is a cross-sectional side view after performing a confined epitaxial growth process over the recessed fins 710. The epitaxial growth process is performed to deposit a crystalline epitaxial layer 801 onto the crystalline substrate 101 beneath. The underlying substrate 101 acts as a seed crystal. Epitaxial layers 801 may be grown from gaseous or liquid precursors and include silicon. The epitaxial layer 801 fills the gaps between the sacrificial layers 201 and 701 and form epitaxial source/drain regions.

Epitaxial silicon may be grown using vapor-phase epitaxy (VPE), molecular-beam epitaxy (MBE), liquid-phase epitaxy (LPE), or other suitable process. The epitaxial silicon can be doped during deposition by adding a dopant or impurity. The silicon may be doped with an n-type dopant (e.g., phosphorus) or a p-type dopant (e.g., boron), depending on the type of transistor.

Figure 9:
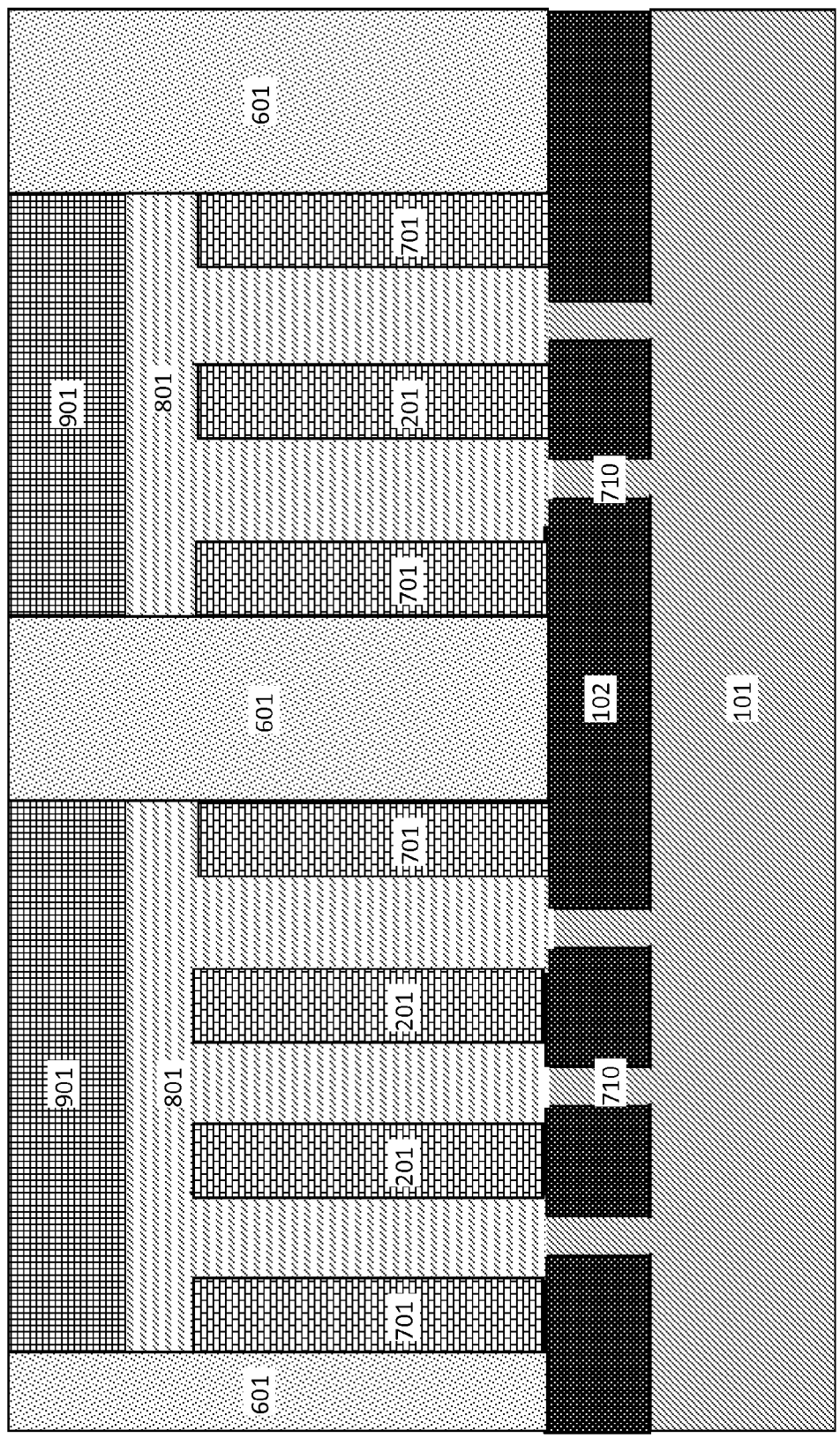

FIG. 9 is a cross-sectional side view after depositing an oxide layer 901 over the epitaxial layer 801. The oxide layer 901 fills the regions between the confinement trenches 601. Non-limiting examples of suitable oxides for the oxide layer 901 include silicon oxide, tetraethylorthosilicate (TEOS) oxide, high aspect ratio plasma (HARP) oxide, silicon oxide, high temperature oxide (HTO), high density plasma (HDP) oxide, oxides (e.g., silicon oxides) formed by an atomic layer deposition (ALD) process, or any combination thereof. A planarization process, for example, chemical-mechanical planarization (CMP), is performed to smooth the surface of the oxide layer 901.

Figure 10A:
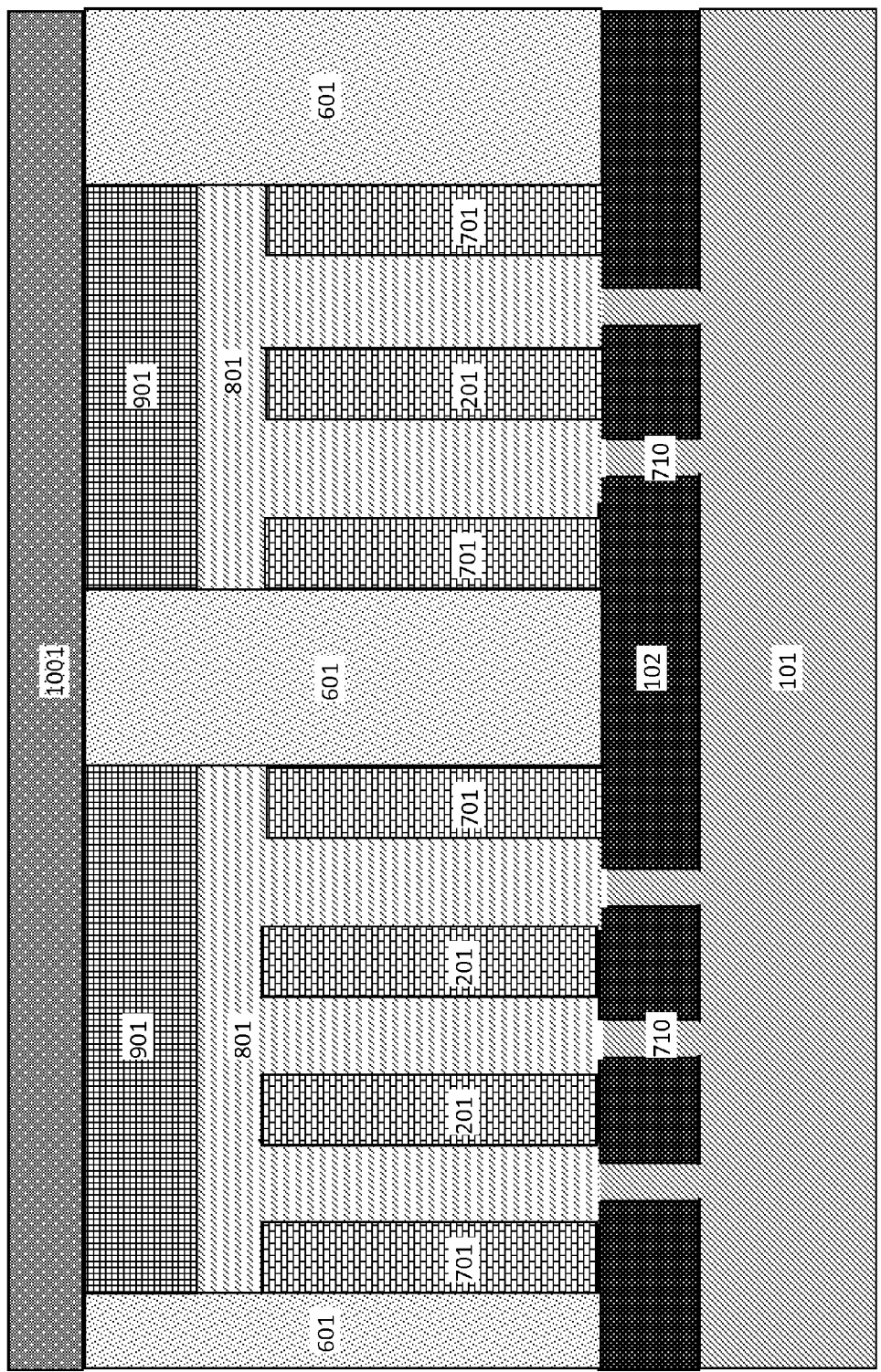
FIG. 10A is a cross-sectional side view after depositing a hard mask layer.

FIG. 10A is a cross-sectional side view after depositing a blanket hard mask layer 1001 over the oxide layer 901. Non-limiting examples of suitable materials for the hard mask layer 1001 include SiN, SiOCN, SiBCN, or any combination thereof.

Figure 10B:
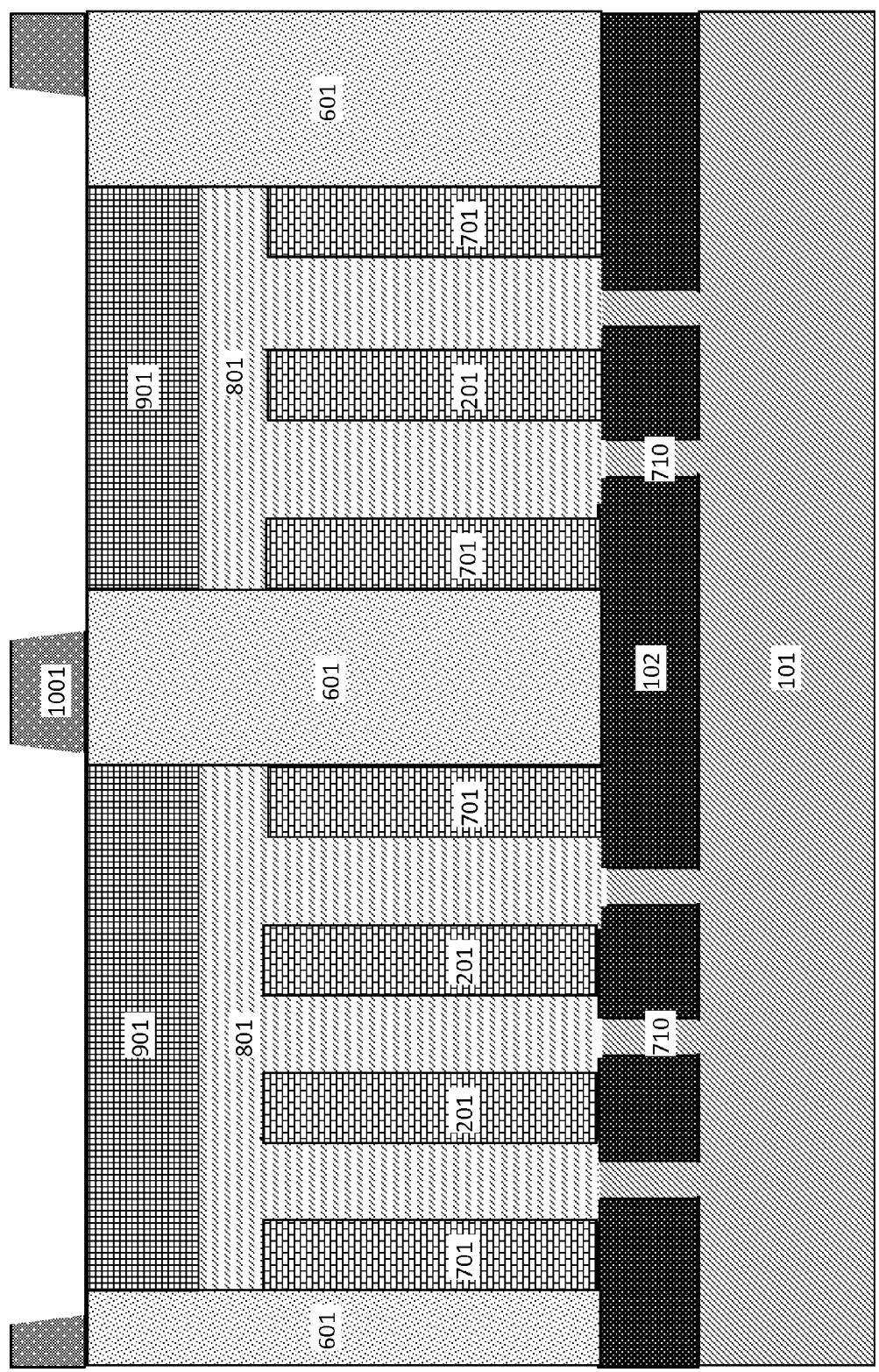
FIG. 10B is a cross-sectional side view after patterning the hard mask layer.

FIG. 10B is a cross-sectional side view after patterning the hard mask layer 1001. The hard mask layer 1001 may be patterned using photolithography and etching as described above. The etching process is timed to only remove the material from the hard mask layer 1001 and to not penetrate the oxide layer 901 beneath.

Figure 10C:
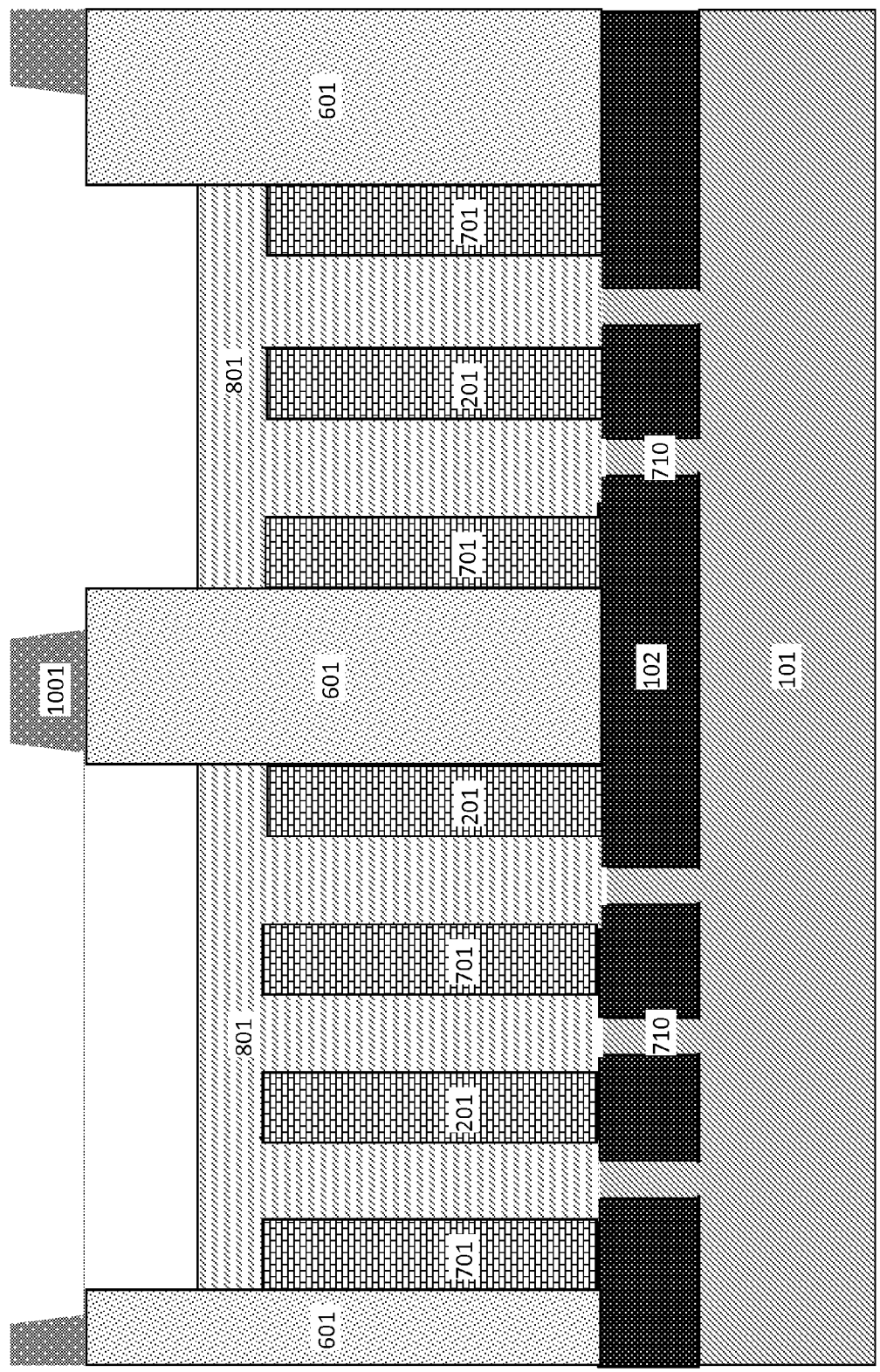
FIG. 10C is a cross-sectional side view after removing the oxide layer over the epitaxial growth.

FIG. 10C is a cross-sectional side view after removing the oxide layer 901 over the epitaxial layer 801. An isotropic etching process, for example, an RIE process with buffered HF may be employed.

Figure 10D:
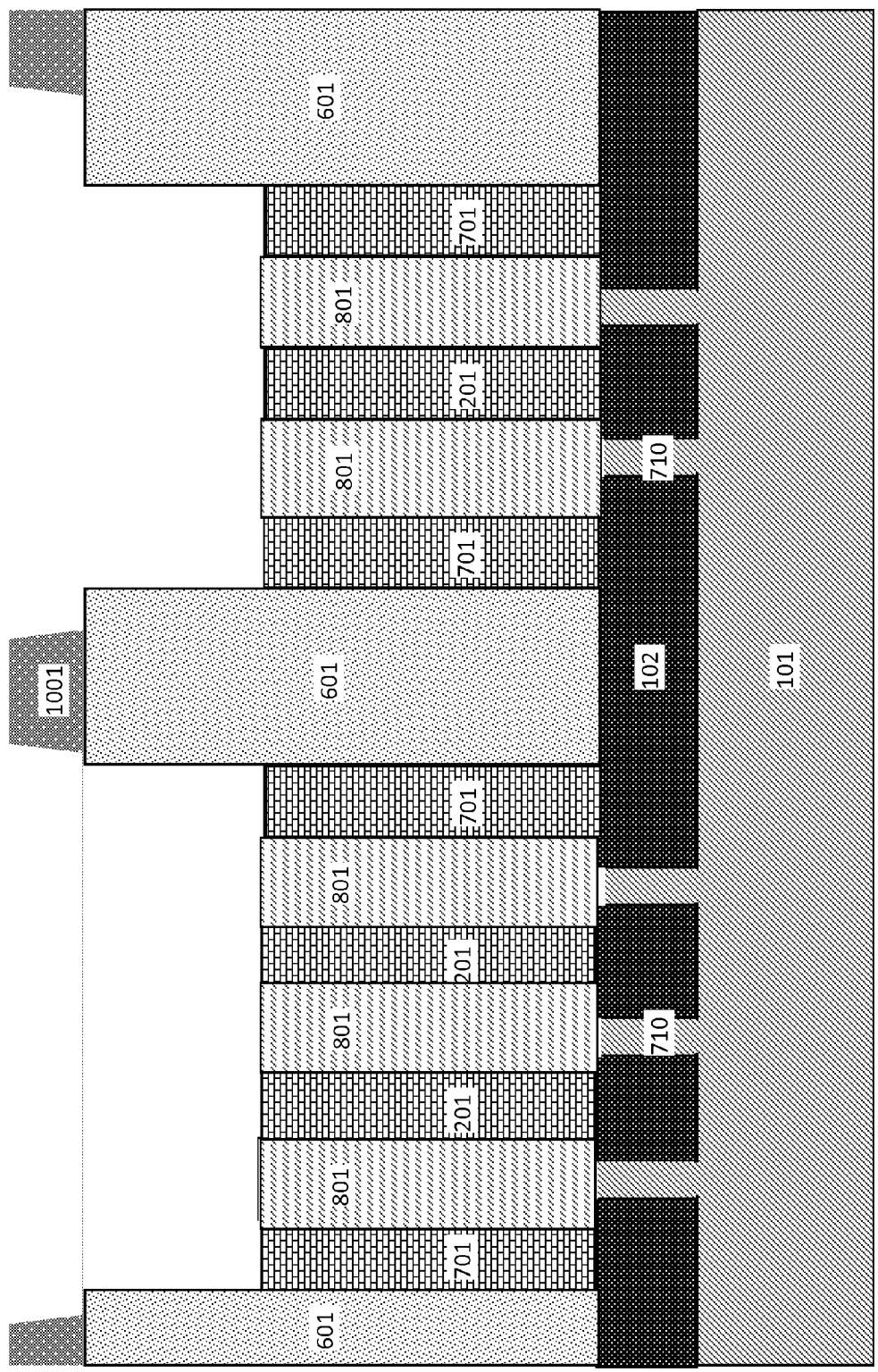
FIG. 10D is a cross-sectional side view after etching back the epitaxial growth to expose the sacrificial material.

FIG. 10D is a cross-sectional side view after recessing the epitaxial growth to expose the sacrificial material in layers 201 and 701. The epitaxial growth over the sacrificial material in layers 201 and 701 is removed to form a planar surface of alternating sacrificial material (layers 201 or 701) and epitaxial growth (epitaxial layer 801).

Figure 10E:
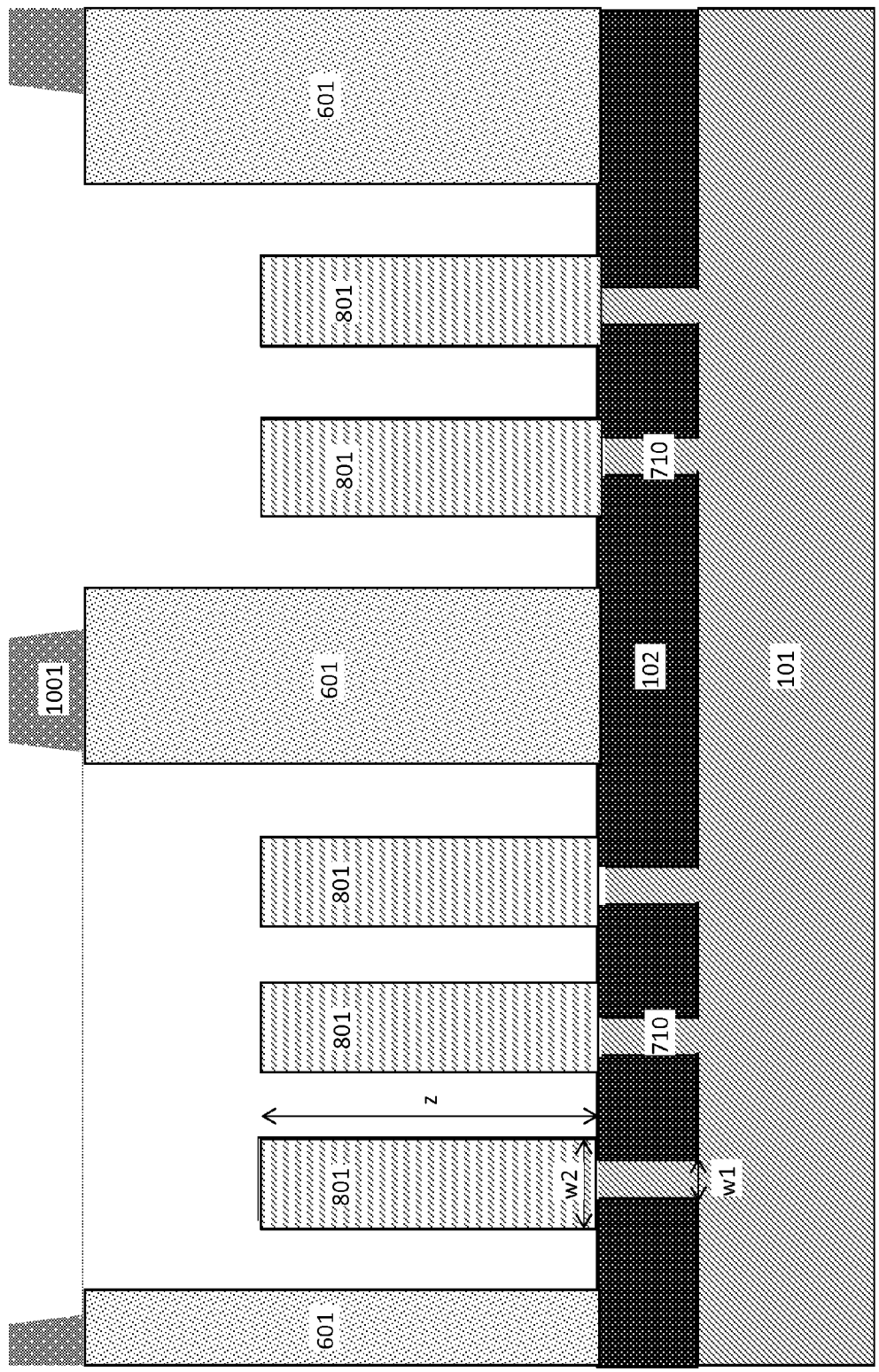
FIG. 10E is a cross-sectional side view after removing the sacrificial material.

FIG. 10E is a cross-sectional side view after removing the sacrificial material from layers 201 and 701, leaving the epitaxial growth in epitaxial layer 801 over the recessed fins 710. The epitaxial growth is wider than the recessed fins 710. In one aspect, the epitaxial growth has a width w2 in a range from about 10 to about 50 nm, and the recessed fin 710 has a width w1 in a range from about 4 to about 12 nm. In other aspect, the epitaxial growth has a width w2 in a range from about 12 to about 25 nm, and the recessed fin 710 has a width in a range from about 6 to about 10 nm. Yet, in another aspect, the recessed fin 710 has a first width, the epitaxial growth (source/drain region) has a second width, and the first width is smaller than the second width.

The epitaxial layers 801 are tall, discrete epitaxy that replace the original fins 110 and form source/drain regions. The epitaxial growth (source/drain regions) over the recessed fins 710 have a height (z) in a range from about 20 to about 120 nm. In one aspect, the thickness of the epitaxial growth over the recessed fins 710 is in a range from about 40 to about 70 nm.

Figure 11A:
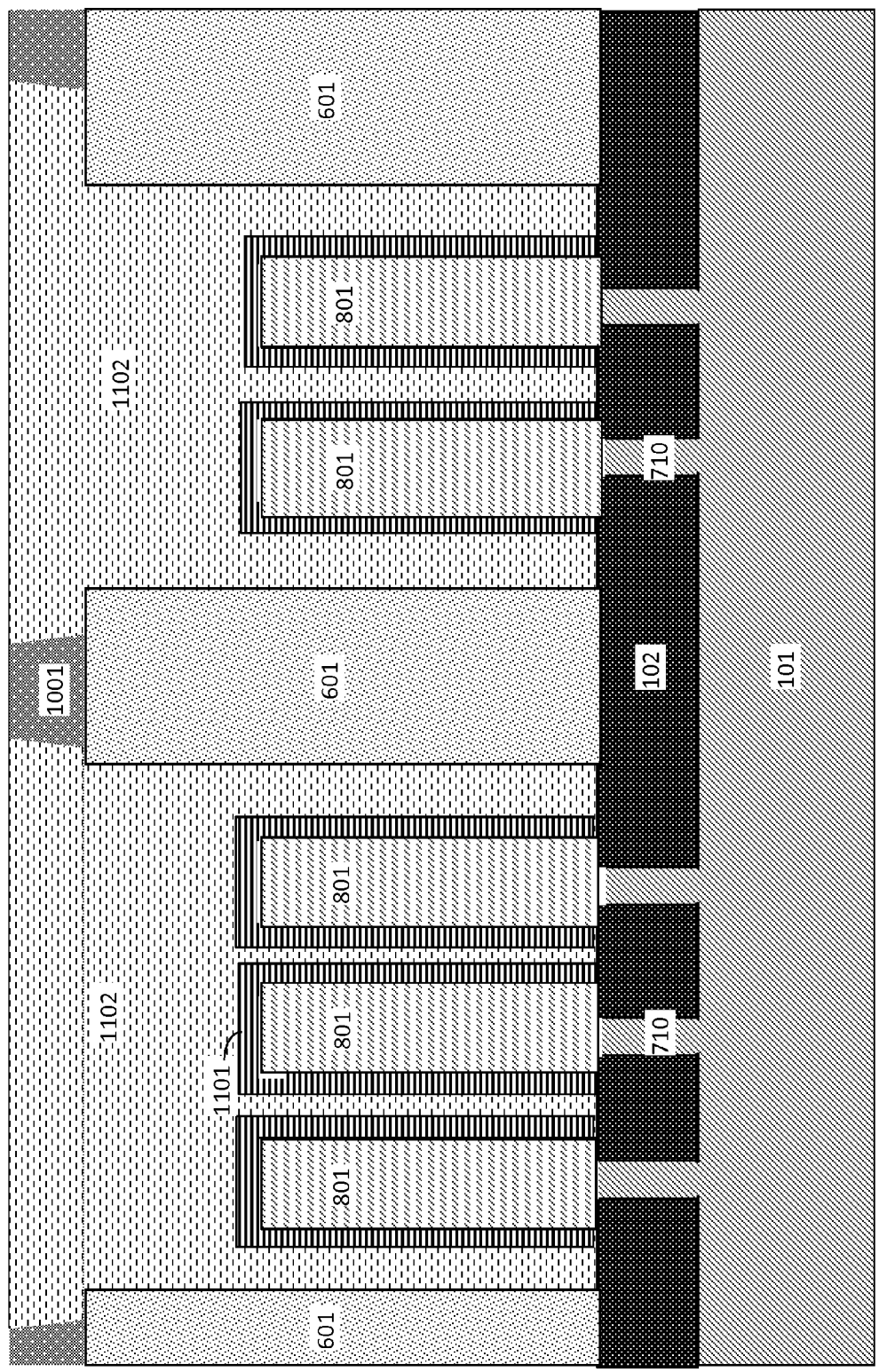
FIG. 11A is a cross-sectional side view after forming a metal silicide layer around the epitaxial growth and depositing a conductive metal.

FIG. 11A is a cross-sectional side view after forming a metal silicide layer 1101 around the epitaxial growth (source/drain region) and depositing a conductive metal 1102. The metal silicide layer 1101 wraps around the each discrete epitaxial growth and insulates each epitaxial growth

801 from the conductive metal 1102. The conductive metal 1102 surrounds each epitaxial growth 801 along three sidewalls. The conductive metal 1102 wraps around each epitaxial growth 801 over each recessed fin 710.

A metal silicide film is formed by performing a thermal treatment to a metallic film. The metallic film can be deposited by performing an evaporation process or a sputtering process. The metallic film is annealed by heating inside a furnace or performing a rapid thermal treatment in an atmosphere containing pure inert gases (e.g., nitrogen or argon) so that the metal reacts with exposed silicon in the substrate 101 to form the metal silicide layer 1101. Non-limiting examples of suitable metal silicide materials include titanium silicide, tungsten silicide, cobalt silicide, nickel silicide, molybdenum silicide, platinum silicide, or any combination thereof. The thickness of the metal silicide layer 1101 may generally vary and is not intended to be limited. In one aspect, the thickness of the metal silicide layer 1101 is in a range from about 1 to about 10 nm. In another aspect, the thickness of the metal silicide layer 1101 is in a range from about 2 to about 5 nm.

Non-limiting examples of suitable conductive metals 1102 include aluminum, platinum, aluminum, platinum, gold, tungsten, titanium, or any combination thereof. The conductive metal 1102 may be deposited by a known deposition process, for example, CVD, PECVD, PVD, plating, thermal or e-beam evaporation, and sputtering.

Figure 11B:
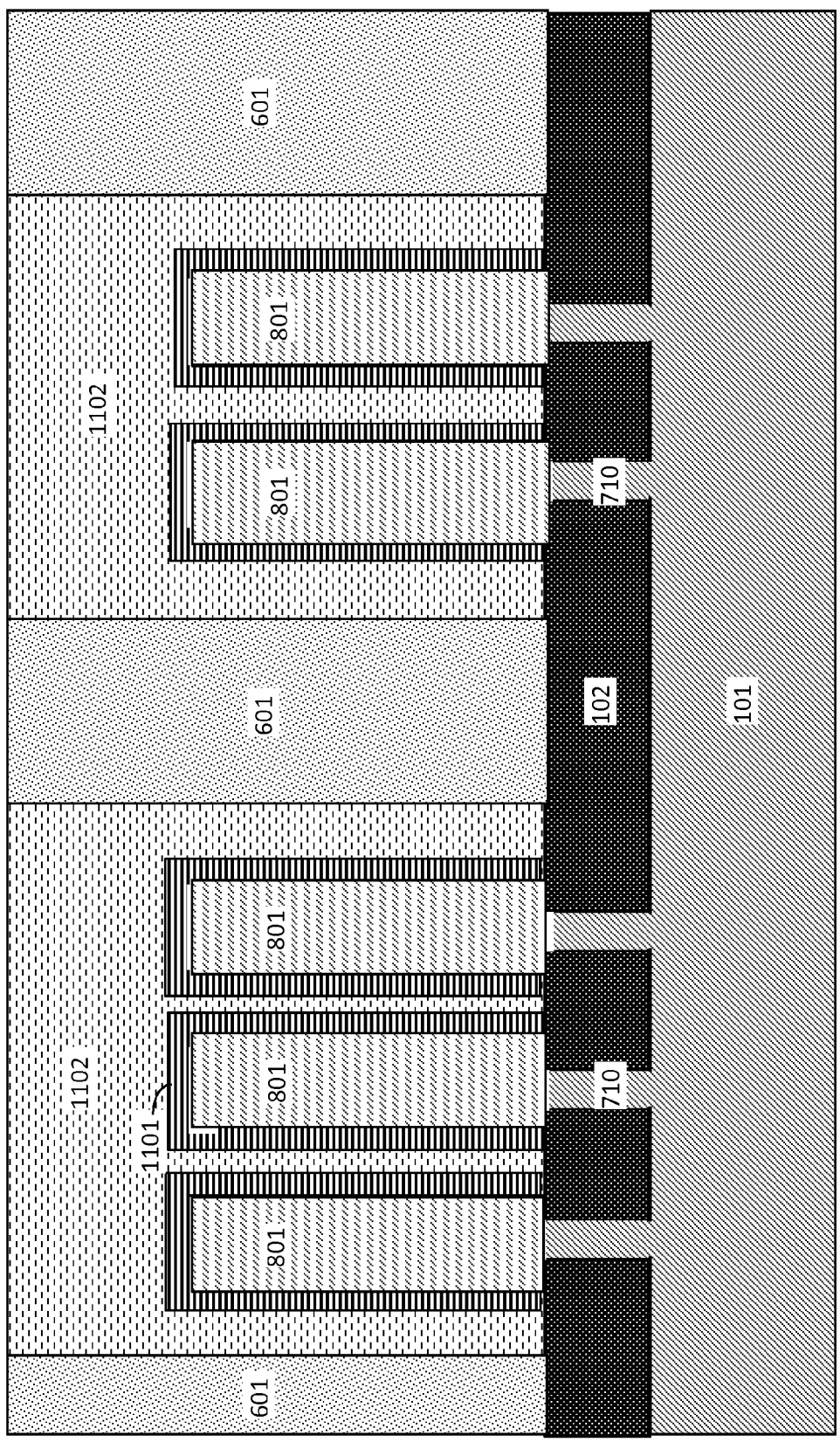

FIG. 11B is a cross-sectional side view after performing a planarization process to polish and smooth the surface of the conductive metal 1102 and form the final structure. The conductive metal 1102 forms the source/drain contact. Because the conductive metal 1102 surrounds the epitaxial growth in epitaxial layer 801, current only has to travel a short distance from the metal contact through epitaxial growth into the channel region.

As described above, embodiments of the present invention provide methods of making semiconductor devices with tall and discrete epitaxial source/drain regions over recessed fin structures, which provide several advantages. Conductive contact materials surround the discrete epitaxial source/drain regions to merge the epitaxial source/drain regions and form an all-around fin in the epitaxial source/drain regions. Embodiments of the inventive structure and methods provide reduced contact resistance in devices with tall fin structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

What is claimed is:

1. A semiconductor device, comprising:
   a substrate;
   isolation regions arranged in the substrate;
   a recessed fin patterned in the substrate between the isolation regions, a top surface of the recessed fin being flush with a top surface of the isolation regions, and the recessed fin having a uniform height along a length of the recessed fin;
   a discrete epitaxial growth arranged over the recessed fin to form a discrete source/drain, the discrete epitaxial growth having a width that is wider than a width of the recessed fin;
   a metal silicide layer arranged on the epitaxial growth; and
   a conductive metal surrounding the metal silicide layer and the epitaxial growth, the conductive metal directly contacting the isolation regions and extending from the isolation regions and over the metal silicide layer.

2. The semiconductor device of claim 1, wherein the recessed fin has a width in a range from about 4 to about 12 nm.

3. The semiconductor device of claim 1, wherein the epitaxial growth has a width in a range from about 10 to about 50 nm.

4. The semiconductor device of claim 1, further comprising another epitaxial growth over another adjacent recessed fin.

5. The semiconductor device of claim 4, wherein the epitaxial growths are discrete and each surrounded by the conductive metal along three sidewalls.

6. The semiconductor device of claim 1, further comprising a metal silicide layer between the conductive metal and the epitaxial growth.

* * * * *